US011373927B2

United States Patent
Wang et al.

(10) Patent No.: US 11,373,927 B2
(45) Date of Patent: Jun. 28, 2022

(54) PACKAGE SUBSTRATE AND MANUFACTURING METHOD HAVING A MESH GAS-PERMEABLE STRUCTURE DISPOSED IN THE THROUGH HOLE

(71) Applicant: Unimicron Technology Corp., Taoyuan (TW)

(72) Inventors: Chin-Sheng Wang, Taoyuan (TW); Ra-Min Tain, Hsinchu County (TW); Pei-Chang Huang, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 476 days.

(21) Appl. No.: 16/683,266

(22) Filed: Nov. 14, 2019

(65) Prior Publication Data

US 2020/0083142 A1 Mar. 12, 2020

Related U.S. Application Data

(63) Continuation-in-part of application No. 16/029,659, filed on Jul. 9, 2018, now Pat. No. 10,515,870.

(30) Foreign Application Priority Data

May 30, 2018 (TW) .................................. 107118580
Oct. 4, 2019 (TW) .................................. 108136042

(51) Int. Cl.
*H01L 23/367* (2006.01)
*H01L 23/42* (2006.01)
(Continued)

(52) U.S. Cl.
CPC .......... *H01L 23/42* (2013.01); *H01L 21/4857* (2013.01); *H01L 23/14* (2013.01);
(Continued)

(58) Field of Classification Search
CPC ............. H01L 23/3672; H01L 23/3677; H01L 23/3731; H01L 23/4983; H01L 21/4857
(Continued)

(56) References Cited

U.S. PATENT DOCUMENTS

| 2013/0032390 | A1 | 2/2013 | Hu et al. |
| 2013/0319734 | A1 | 12/2013 | Shin et al. |
| 2017/0339784 | A1* | 11/2017 | Zluc ..................... H05K 1/0366 |

FOREIGN PATENT DOCUMENTS

| TW | 587319 | 5/2004 |
| TW | 200838387 | 9/2008 |

(Continued)

OTHER PUBLICATIONS

"Office Action of Taiwan Counterpart Application", dated Apr. 17, 2020, p. 1-p. 8.

*Primary Examiner* — Hoai V Pham
(74) *Attorney, Agent, or Firm* — JCIPRNET

(57) ABSTRACT

A package substrate includes a multilayer circuit structure, a gas-permeable structure, a heat conducting component, a first circuit layer, a second circuit layer and a build-up circuit structure. The gas-permeable structure and the heat conducting component are respectively disposed in a first and a second through holes of the multilayer circuit structure. The first and the second circuit layers are respectively disposed on an upper and a lower surfaces of the multilayer circuit structure and expose a first and a second sides of the gas-permeable structure. The build-up circuit structure is disposed on the first circuit layer and includes at least one patterned photo-imageable dielectric layer and at least one patterned circuit layer alternately stacked. The patterned circuit layer is electrically connected to the first circuit layer by at least one opening. The build-up circuit structure and the first circuit layer exposed by a receiving opening form a recess.

20 Claims, 10 Drawing Sheets

(51) Int. Cl.
  *H01L 23/498* (2006.01)
  *H01L 23/18* (2006.01)
  *H01L 23/467* (2006.01)
  *H01L 23/14* (2006.01)
  *H01L 21/48* (2006.01)
  *H01L 23/00* (2006.01)

(52) U.S. Cl.
  CPC .......... *H01L 23/18* (2013.01); *H01L 23/3672* (2013.01); *H01L 23/467* (2013.01); *H01L 23/49822* (2013.01); *H01L 23/49838* (2013.01); *H01L 24/48* (2013.01); *H01L 2224/48228* (2013.01)

(58) Field of Classification Search
  USPC ....................................................... 257/276
  See application file for complete search history.

(56) References Cited

FOREIGN PATENT DOCUMENTS

| | | |
|---|---|---|
| TW | I544850 | 8/2016 |
| TW | I590350 | 7/2017 |
| TW | I653911 | 3/2019 |

\* cited by examiner

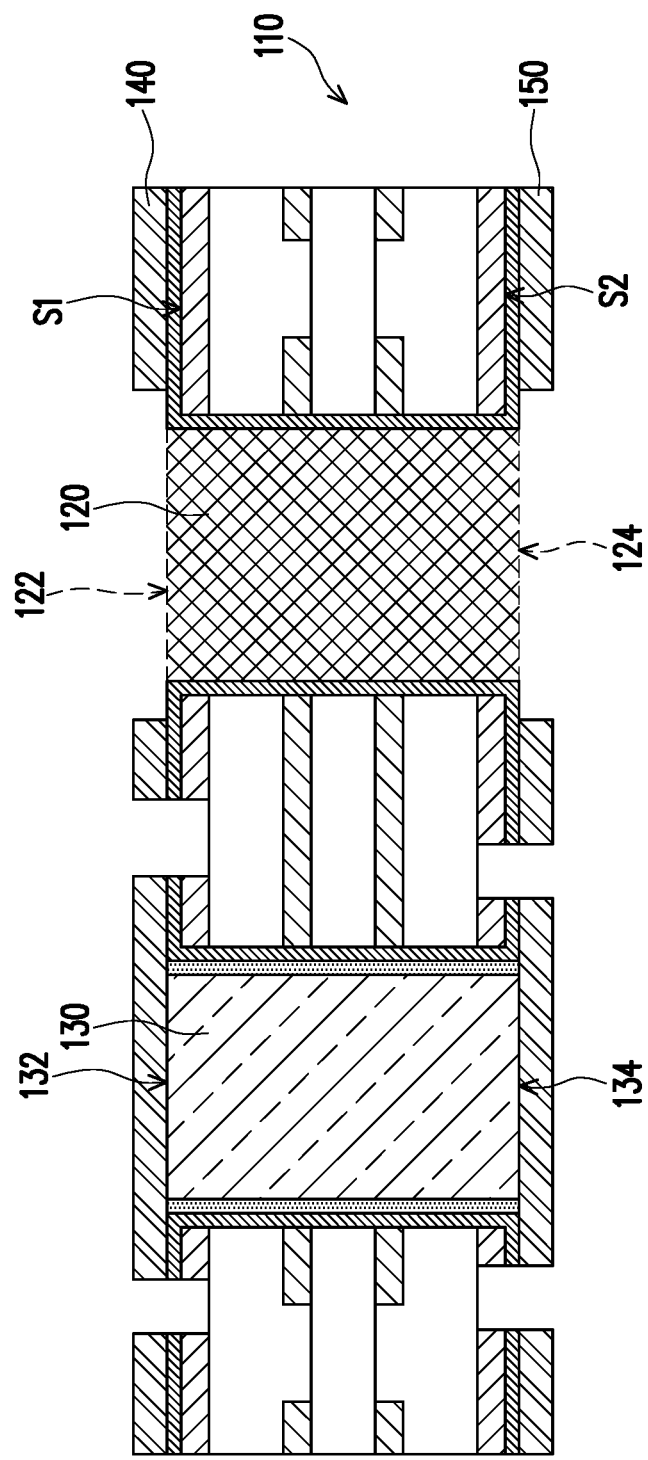

PACKAGE SUBSTRATE AND MANUFACTURING METHOD HAVING A MESH GAS-PERMEABLE STRUCTURE DISPOSED IN THE THROUGH HOLE

CROSS-REFERENCE TO RELATED APPLICATION

This application is a continuation-in-part application of and claims the priority benefit of U.S. application Ser. No. 16/029,659, filed on Jul. 9, 2018, now allowed. The prior U.S. application Ser. No. 16/029,659 claims the priority benefit of Taiwan application serial no. 107118580, filed on May 30, 2018. This application also claims the priority benefit of Taiwan application serial no. 108136042, filed on Oct. 4, 2019. The entirety of each of the above-mentioned patent applications is hereby incorporated by reference herein and made a part of this specification.

BACKGROUND

Technical Field

The disclosure relates to a substrate structure and a manufacturing method thereof, and more particularly to a package substrate and a manufacturing method thereof.

Description of Related Art

Generally, a package substrate is mainly formed by multiple layers of circuit layers, wherein a heat generating component such as a wafer is mostly disposed on an upper surface of the package substrate. Since the heat generating component is prone to generate heat when it is operates, the operational efficiency of the heat generating component is likely to be affected. The heat dissipation path of the package substrate today mainly dissipates heat in a thickness direction (perpendicular to the substrate surface). However, the above heat dissipation method is still insufficient and cannot quickly transmit the heat generated by the heat generating component to the outside, which causes the temperature of the package substrate to rise continuously, thereby affecting the reliability of the heat generating component.

SUMMARY

The disclosure provides a package substrate with a better heat dissipation effect.

The disclosure further provides a manufacturing method of a package substrate for manufacturing the above package substrate.

A package substrate of the disclosure includes a multilayer circuit structure, a gas-permeable structure, a heat conducting component, a first circuit layer, a second circuit layer, and a build-up circuit structure. The multilayer circuit structure has an upper surface and a lower surface opposite to each other, and a first through hole and a second through hole connecting the upper surface and the lower surface. The gas-permeable structure is in the form of a mesh and is disposed in the first through hole. The heat conducting component is disposed in the second through hole. The first circuit layer is disposed on the upper surface of the multilayer circuit structure, covers the upper surface and a top surface of the heat conducting component, and exposes a first side of the gas-permeable structure. The second circuit layer is disposed on the lower surface of the multilayer circuit structure, covers the lower surface and a bottom surface of the heat conducting component, and exposes a second side of the gas-permeable structure. The build-up circuit structure is disposed on the first circuit layer and includes at least one patterned photo-imageable dielectric layer and at least one patterned circuit layer alternately stacked. The patterned photo-imageable dielectric layer has at least one opening and a receiving opening exposing a portion of the first circuit layer. The patterned circuit layer is electrically connected to the first circuit layer by the opening. The build-up circuit structure and the first circuit layer exposed by the receiving opening form a recess.

In an embodiment of the disclosure, the above package substrate further includes a seed layer covering the upper surface, the lower surface, an inner wall of the first through hole, and an inner wall of the second through hole of the multilayer circuit structure.

In an embodiment of the disclosure, the above package substrate further includes an insulating material disposed in the second through hole and located between the heat conducting component and the second through hole.

In an embodiment of the disclosure, the above package substrate further includes a first solder mask layer and a second solder mask layer. The first solder mask layer is disposed on the build-up circuit structure and has at least one first opening, wherein the first opening exposes a portion of the build-up circuit structure. The second solder mask layer is disposed on the second circuit layer and has at least one second opening, wherein the second opening exposes a portion of the second circuit layer.

In an embodiment of the disclosure, the above package substrate further includes a heat dissipation assembly disposed in the second opening of the second solder mask layer and contacting the second circuit layer.

In an embodiment of the disclosure, the heat dissipation assembly includes a heat dissipation block, a heat dissipation fin or a heat pipe.

In an embodiment of the disclosure, the above package substrate further includes a first surface treatment layer and a second surface treatment layer. The first surface treatment layer is disposed on the first circuit layer forming the recess. The second surface treatment layer is disposed on the second circuit layer exposed by the second solder mask layer.

In an embodiment of the disclosure, a material of the gas-permeable structure includes metal, graphite, synthetic diamond or ceramic.

In an embodiment of the disclosure, a material of the heat conducting component includes ceramic, graphite, metal, synthetic diamond or a combination of the foregoing materials.

In an embodiment of the disclosure, the multilayer circuit structure includes a core layer, a first dielectric layer, a second dielectric layer, a first inner circuit layer and a second inner circuit layer. The core layer has a first surface and a second surface opposite to each other and includes a core dielectric layer, a first patterned copper foil layer, and a second patterned copper foil layer. The core dielectric layer has a first side surface and a second side surface opposite to each other. The first patterned copper foil layer is disposed on the first side surface of the core dielectric layer and exposes a portion of the first side surface. The second patterned copper foil layer is disposed on the second side surface of the core dielectric layer and exposes a portion of the second side surface. The first dielectric layer is disposed on the first surface of the core layer. The second dielectric layer is disposed on the second surface of the core layer. The first inner circuit layer is disposed on the first dielectric layer. The second inner circuit layer is disposed on the second dielectric layer.

A manufacturing method of a package substrate of the disclosure includes the following steps. A multilayer circuit structure is formed. The multilayer circuit structure has an upper surface and a lower surface opposite to each other, and a first through hole and a second through hole connecting the upper surface and the lower surface. A gas-permeable structure and a heat conducting component are respectively disposed in the first through hole and the second through hole. A first circuit layer and a second circuit layer are respectively formed on the upper surface and the lower surface of the multilayer circuit structure. The first circuit layer covers the upper surface and a top surface of the heat conducting component and exposes a first side of the gas-permeable structure. The second circuit layer covers the lower surface and a bottom surface of the heat conducting component and exposes a second side of the gas-permeable structure. A photo-imageable dielectric material layer is formed on the first circuit layer. An exposure process and a development process are performed on the photo-imageable dielectric material layer to form a patterned photo-imageable dielectric layer. The patterned photo-imageable dielectric layer has at least one opening and a receiving opening exposing a portion of the first circuit layer. A patterned circuit layer is formed on the patterned photo-imageable dielectric layer. The patterned circuit layer is electrically connected to the first circuit layer by the opening. The patterned photo-imageable dielectric layer and the patterned circuit layer form a build-up circuit structure. The build-up circuit structure and the first circuit layer exposed by the receiving opening form a recess.

In an embodiment of the disclosure, the above manufacturing method of the package substrate further includes the following: before the gas-permeable structure and the heat conducting component are respectively disposed in the first through hole and the second through hole, a seed layer is formed to cover the upper surface, the lower surface, an inner wall of the first through hole, and an inner wall of the second through hole of the multilayer circuit structure.

In an embodiment of the disclosure, the above manufacturing method of the package substrate further includes the following: after the gas-permeable structure and the heat conducting component are respectively disposed in the first through hole and the second through hole and before the first circuit layer and the second circuit layer are respectively formed on the upper surface and the lower surface of the multilayer circuit structure, an insulating material is formed in the second through hole so that the insulating material is located between the heat conducting component and the second through hole.

In an embodiment of the disclosure, the above manufacturing method of the package substrate further includes the following: after the build-up circuit structure is formed, a first solder mask layer is formed on the build-up circuit structure, and a second solder mask layer is formed on the second circuit layer. The first solder mask layer has at least one first opening, and the first opening exposes a portion of the build-up circuit structure. The second solder mask layer has at least one second opening, and the second opening exposes a portion of the second circuit layer.

In an embodiment of the disclosure, the above manufacturing method of the package substrate further includes the following: after the first solder mask layer and the second solder mask layer are formed, a heat dissipation assembly is disposed in the second opening of the second solder mask layer, wherein the heat dissipation assembly contacts the second circuit layer.

In an embodiment of the disclosure, the heat dissipation assembly includes a heat dissipation block, a heat dissipation fin or a heat pipe.

In an embodiment of the disclosure, the above manufacturing method of the package substrate further includes the following: after the first solder mask layer and the second solder mask layer are formed, a first surface treatment layer is formed on the first circuit layer forming the recess, and a second surface treatment layer is formed on the second circuit layer exposed by the second solder mask layer.

In an embodiment of the disclosure, a material of the gas-permeable structure includes metal, graphite, synthetic diamond or ceramic.

In an embodiment of the disclosure, a material of the heat conducting component includes ceramic, graphite, metal, synthetic diamond or a combination of the foregoing materials.

In an embodiment of the disclosure, forming the multilayer circuit structure includes the following: A core layer is provided. The core layer has a first surface and a second surface opposite to each other and includes a core dielectric layer, a first patterned copper foil layer, and a second patterned copper foil layer. The core dielectric layer has a first side surface and a second side surface opposite to each other. The first patterned copper foil layer is disposed on the first side surface of the core dielectric layer and exposes a portion of the first side surface. The second patterned copper foil layer is disposed on the second side surface of the core dielectric layer and exposes a portion of the second side surface. A first dielectric layer and a first inner circuit layer located on the first dielectric layer are bonded onto the first surface of the core layer, and a second dielectric layer and a second inner circuit layer located on the second dielectric layer are bonded onto the second surface of the core layer. A drilling process is performed on the first inner circuit layer, the first dielectric layer, the core layer, the second dielectric layer, and the second inner circuit layer to form the first through hole and the second through hole.

Based on the above, in the design of the package substrate of the disclosure, the gas-permeable structure is in the form of a mesh, and the gas-permeable structure and the heat conducting component are respectively disposed in the first through hole and the second through hole of the multilayer circuit structure, and the first circuit layer and the second circuit layer respectively expose the first side and the second side of the gas-permeable structure. In this way, the gas-permeable structure and the heat conducting component can dissipate heat in a thickness direction (i.e., the Z direction) of the package substrate; in addition, the gas-permeable structure can also dissipate heat in a plane direction (i.e., the X-Y direction) of the package substrate due to its mesh form design. In short, the package substrate of the disclosure can have a better heat dissipation effect. In addition, the build-up circuit structure formed by the patterned photo-imageable dielectric layer and the patterned circuit layer can increase the circuit density of the package substrate and can shorten the path of signal transmission.

In order to make the aforementioned features and advantages of the disclosure comprehensible, embodiments accompanied with drawings are described in detail below.

BRIEF DESCRIPTION OF THE DRAWINGS

FIGS. 1A to 1F are schematic cross-sectional views showing a manufacturing method of a package substrate according to an embodiment of the disclosure.

DESCRIPTION OF THE EMBODIMENTS

Figure 1A:
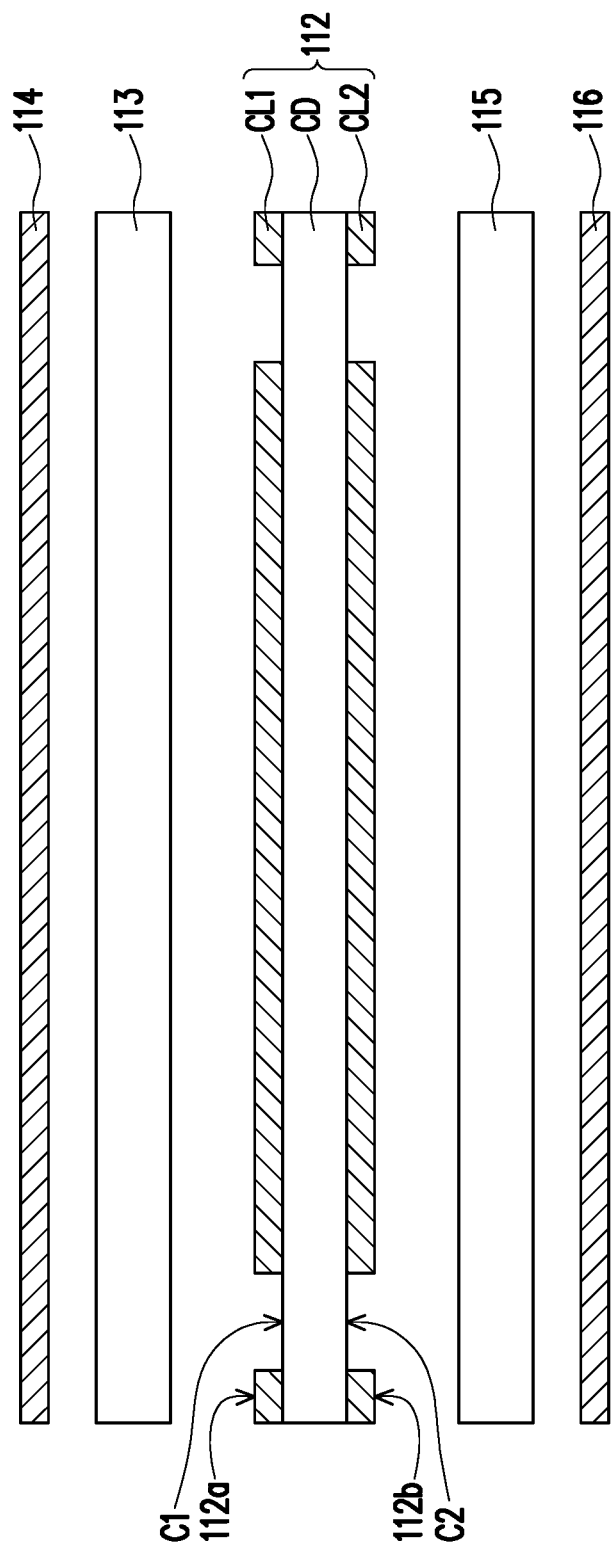

FIGS. 1A to 1F are schematic cross-sectional views showing a manufacturing method of a package substrate according to an embodiment of the disclosure. Regarding the manufacturing method of the package substrate of the embodiment, first, referring to FIG. 1A, a core layer 112 is provided. The core layer 112 has a first surface 112a and a second surface 112b opposite to each other, and includes a core dielectric layer CD, a first patterned copper foil layer CL1, and a second patterned copper foil layer CL2. The core dielectric layer CD has a first side surface C1 and a second side surface C2 opposite to each other. The first patterned copper foil layer CL1 is disposed on the first side surface C1 of the core dielectric layer CD and exposes a portion of the first side surface C1. The second patterned copper foil layer CL2 is disposed on the second side surface C2 of the core dielectric layer CD and exposes a portion of the second side surface C2.

Next, referring again to FIG. 1A, a first dielectric layer 113 and a first inner circuit layer 114 located on the first dielectric layer 113 are provided on the first surface 112a of the core layer 112, and a second dielectric layer 115 and a second inner circuit layer 116 located on the second dielectric layer 115 are provided on the second surface 112b of the core layer 112.

Figure 1B:
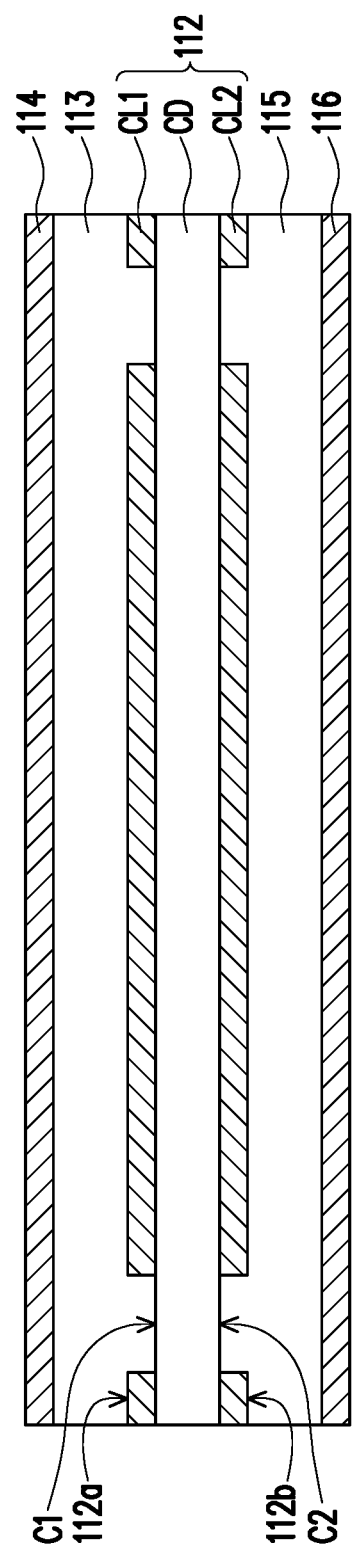

Next, referring to FIG. 1B, by thermocompression bonding, the first dielectric layer 113 and the first inner circuit layer 114 located on the first dielectric layer 113 are bonded onto the first surface 112a of the core layer 112, and the second dielectric layer 115 and the second inner circuit layer 116 located on the second dielectric layer 115 are bonded onto the second surface 112b of the core layer 112.

Figure 1C:
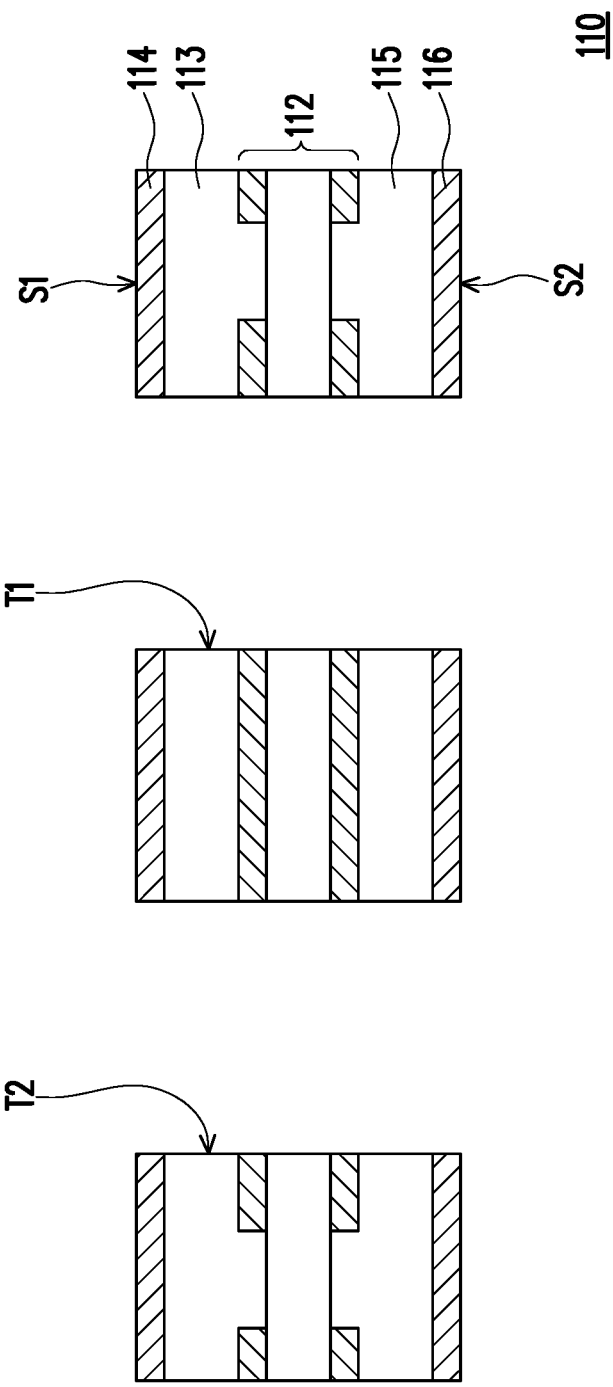

Next, referring to FIG. 1C, a drilling process is performed on the first inner circuit layer 114, the first dielectric layer 113, the core layer 112, the second dielectric layer 115, and the second inner circuit layer 116 to form a first through hole T1 and a second through hole T2. By this time, a multilayer circuit structure 110 has been formed. Here, the multilayer circuit structure 110 has an upper surface S1 and a lower surface S2 opposite to each other, and the first through hole T1 and the second through hole T2 connecting the upper surface S1 and the lower surface S2.

Figure 1D:
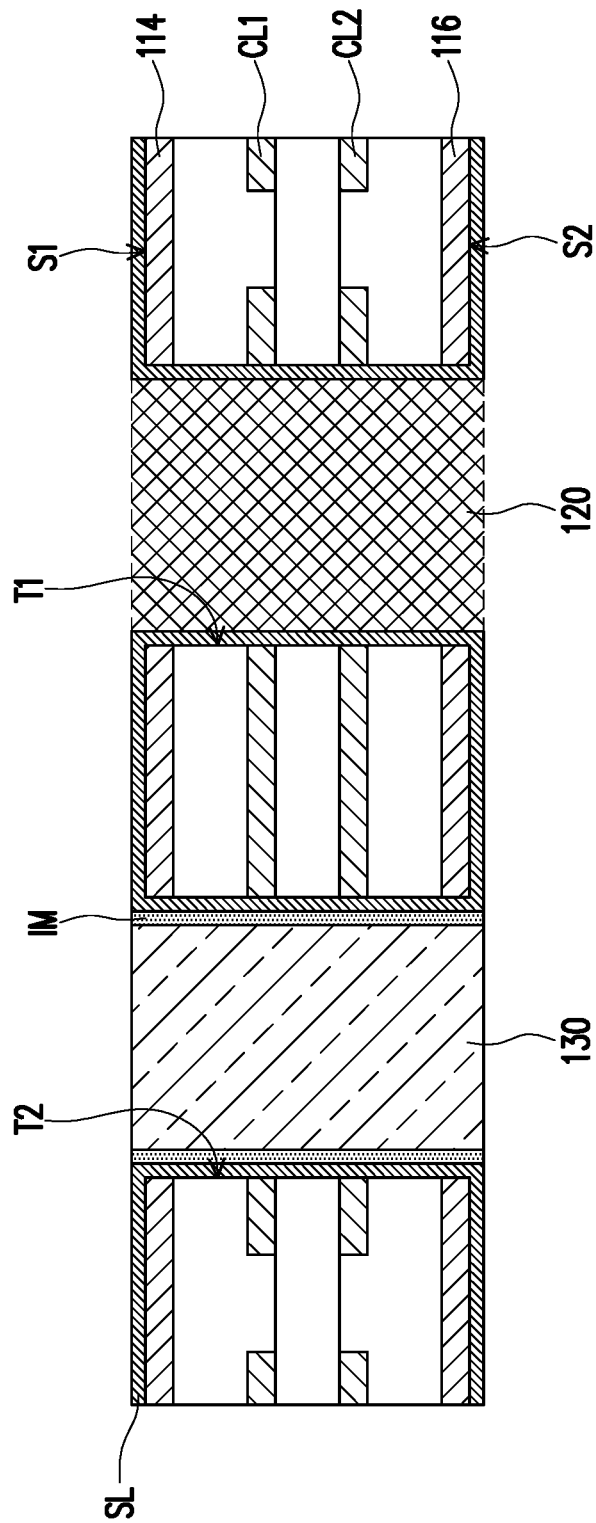

Next, referring to FIG. 1D, a seed layer SL may be selectively formed to cover the upper surface S1, the lower surface S2, an inner wall of the first through hole T1, and an inner wall of the second through hole T2 of the multilayer circuit structure 110. The first inner circuit layer 114, the first patterned copper foil layer CL1, the second patterned copper foil layer CL2, and the second inner circuit layer 116 may be electrically conducted by the disposition of the seed layer SL.

Next, referring again to FIG. 1D, a gas-permeable structure 120 and a heat conducting component 130 are respectively disposed in the first through hole T1 and the second through hole T2. Here, a material of the gas-permeable structure 120 is, for example, metal, graphite, synthetic diamond or ceramic, wherein the metal is, for example, gold, silver, copper, aluminum or other metals having a high thermal conductivity. A material of the heat conducting component 130 is, for example, ceramic, graphite, metal, synthetic diamond or a combination of the foregoing materials.

Referring to FIG. 1D again, an insulating material IM is formed in the second through hole T2, so that the insulating material IM is located between the heat conducting component 130 and the second through hole T2. Here, the insulating material IM is located between the seed layer SL and the heat conducting component 130, and the heat conducting component 130 is fixed in the second through hole T2 by the insulating material IM.

Figure 2A:
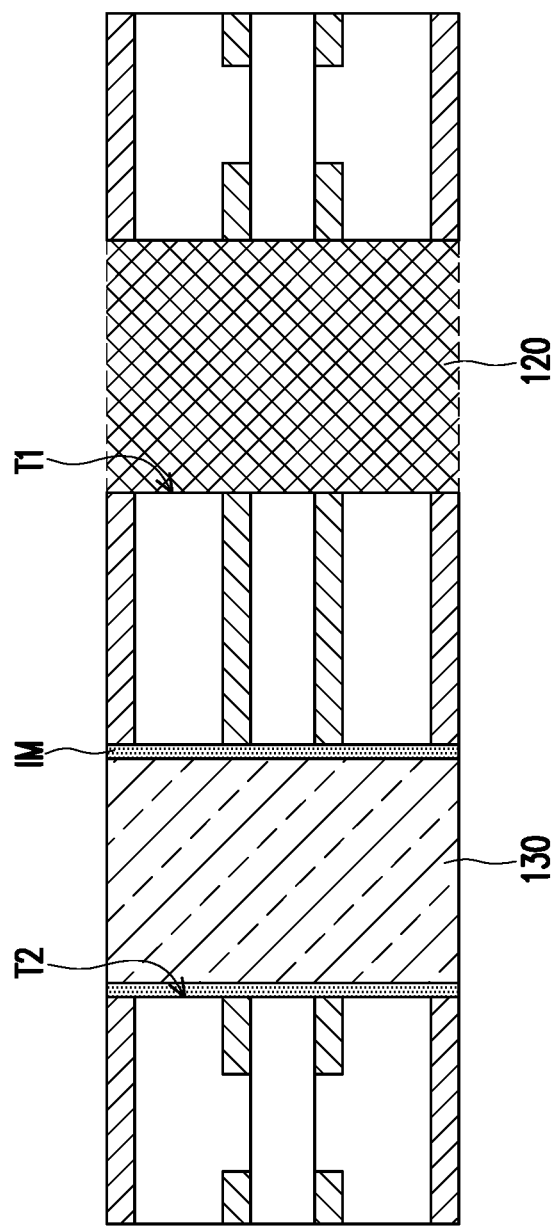
FIG. 2A is a schematic cross-sectional view showing a partial step of a manufacturing method of a package substrate according to another embodiment of the disclosure.

It should be noted that, if there is no need to electrically conduct upper and lower circuits, the seed layer SL in FIG. 1D may not be disposed; instead, the insulating material IM may be directly filled in the second through hole T2 after the gas-permeable structure 120 and the heat conducting component 130 are disposed in the first through hole T1 and the second through hole T2, so that the insulating material IM is located between the inner wall of the second through hole T2 and the heat conducting component 130 to fix the heat conducting component 130, as shown in FIG. 2A, and this still falls in the scope of the disclosure.

Referring to FIG. 1E, after the step of FIG. 1D, a first circuit layer 140 and a second circuit layer 150 are respectively formed on the upper surface S1 and the lower surface S2 of the multilayer circuit structure 110. The first circuit layer 140 covers the upper surface S1 and a top surface 132 of the heat conducting component 130 and exposes a first side 122 of the gas-permeable structure 120. The second circuit layer 150 covers the lower surface S2 and a bottom surface 134 of the heat conducting component 130 and exposes a second side 124 of the gas-permeable structure 120.

Figure 1F:
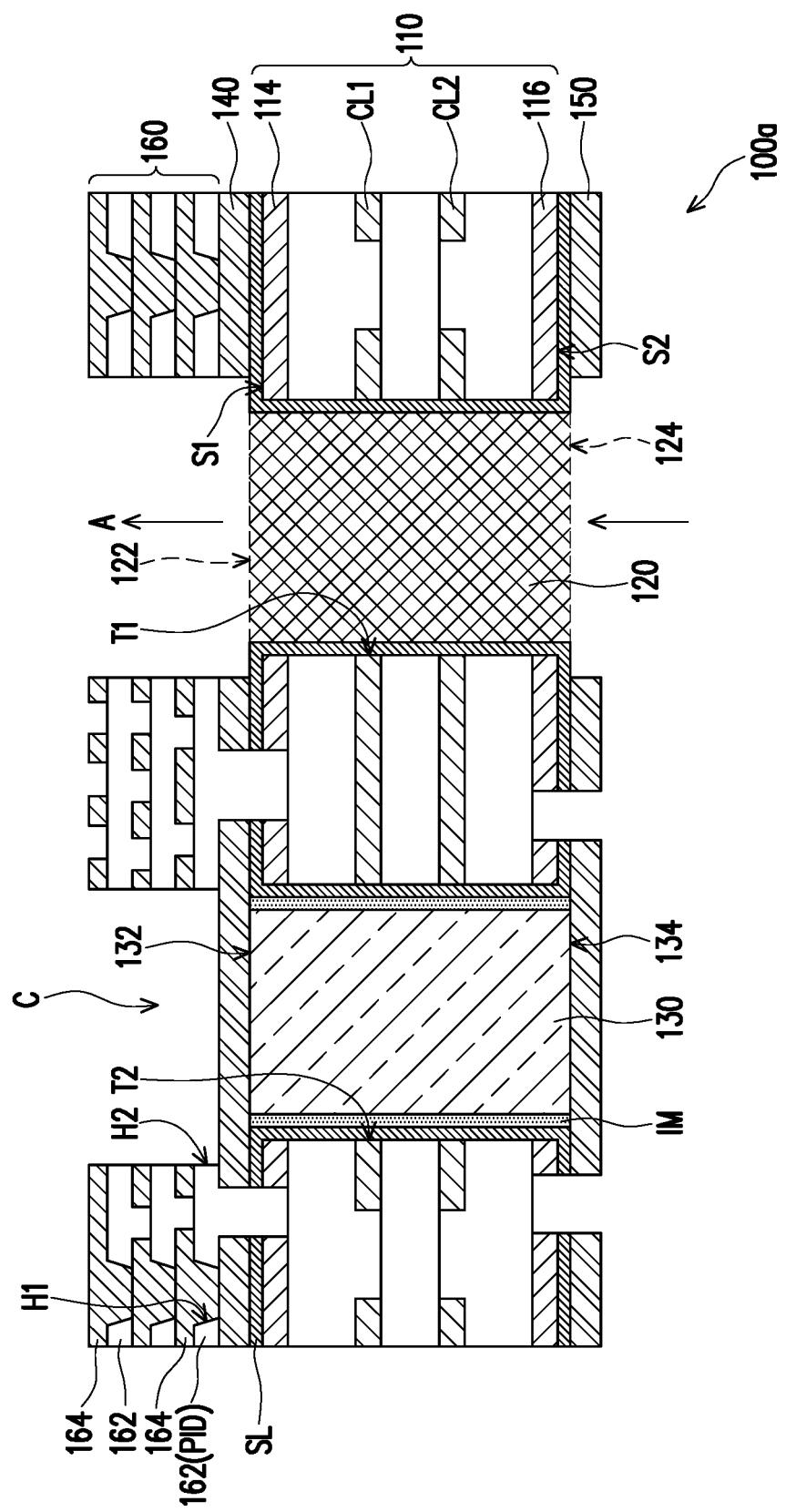

Next, referring to FIG. 1F, a photo-imageable dielectric material layer PID is formed on the first circuit layer 140. Next, an exposure process and a development process are performed on the photo-imageable dielectric material layer PID to form a patterned photo-imageable dielectric layer 162. Here, the patterned photo-imageable dielectric layer 162 has at least one opening H1 and a receiving opening H2 exposing a portion of the first circuit layer 140.

Next, referring again to FIG. 1F, a patterned circuit layer 164 is formed on the patterned photo-imageable dielectric layer 162. The patterned circuit layer 164 is electrically connected to the first circuit layer 140 by the opening H1. The above step of forming the photo-imageable dielectric material layer PID, performing the exposure process and the development process on the photo-imageable dielectric material layer PID to form the patterned photo-imageable dielectric layer 162, and forming the patterned circuit layer 164 on the patterned photo-imageable dielectric layer 162 is repeated to manufacture the patterned photo-imageable dielectric layers 162 and the patterned circuit layers 164 which are multi-layered and alternately stacked to form a build-up circuit structure 160. At this time, the build-up circuit structure 160 and the first circuit layer 140 exposed by the receiving opening H2 form a recess C. By this time, the manufacturing of the package substrate 100a has been completed.

Since the embodiment uses the photo-imageable dielectric material layer PID as the material of the dielectric layer, the patterned photo-imageable dielectric layer 162 can be formed simply by performing the exposure process and the development process on the photo-imageable dielectric material layer PID. In this way, the formed build-up circuit structure 160 can have a smaller line width and line pitch, which can increase the wiring density of the package substrate 100a. Moreover, the combination of the build-up circuit structure 160 including the patterned photo-imageable dielectric layers 162 and the multilayer circuit structure 110 can eliminate the conventional need to manufacture an interposer or a redistribution layer (RDL). In addition, compared with a conventional build-up circuit structure that uses a conventional dielectric layer (whose material is, for example, Ajinomoto build-up film (ABF), glass fiber pregpreg (PP) or polyimide (PI)), the build-up circuit structure 160 formed by the patterned photo-imageable dielectric layers 162 and the patterned circuit layers 164 can have a thinner thickness and can shorten the path of signal transmission.

Regarding the structure, referring again to FIG. 1F, the package substrate 100a includes the multilayer circuit structure 110, the gas-permeable structure 120, the heat conducting component 130, the first circuit layer 140, the second circuit layer 150 and the build-up circuit structure 160. The multilayer circuit structure 110 has the upper surface S1 and the lower surface S2 opposite to each other, and the first through hole T1 and the second through hole T2 connecting the upper surface S1 and the lower surface S2. The gas-permeable structure 120 is in the form of a mesh and is disposed in the first through hole T1. The heat conducting component 130 is disposed in the second through hole T2. The first circuit layer 140 is disposed on the upper surface S1 of the multilayer circuit structure 110, covers the upper surface S1 and the top surface 132 of the heat conducting component 130, and exposes the first side 122 of the gas-permeable structure 120. The second circuit layer 150 is disposed on the lower surface S2 of the multilayer circuit structure 110, covers the lower surface S2 and the bottom surface 134 of the heat conducting component 130, and exposes the second side 124 of the gas-permeable structure 120. The build-up circuit structure 160 is disposed on the first circuit layer 140 and includes the patterned photo-imageable dielectric layers 162 and the patterned circuit layers 164 alternately stacked. The patterned photo-imageable dielectric layer 162 has the opening H1 and the receiving opening H2 exposing a portion of the first circuit layer 140. The patterned circuit layer 164 is electrically connected to the first circuit layer 140 by the opening H1. The build-up circuit structure 160 and the first circuit layer 140 exposed by the receiving opening H2 form the recess C.

In order to electrically conduct the first patterned copper foil layer CL1, the second patterned copper foil layer CL2, the first inner circuit layer 114, and the second inner circuit layer 116, the package substrate 100a of the embodiment may further include the seed layer SL to cover the upper surface S1, the lower surface S2, the inner wall of the first through hole T1, and the inner wall of the second through hole T2 of the multilayer circuit structure 110. In addition, the package substrate 100a further includes the insulating material IM disposed in the second through hole T2 and located between the heat conducting component 130 and the second through hole T2 to fix the heat conducting component 130 and to prevent the heat conducting component 130 from being electrically conducted with the seed layer SL.

In short, in the design of the package substrate 100a of the embodiment, the gas-permeable structure 120 is in the form of a mesh, and the gas-permeable structure 120 and the heat conducting component 130 are respectively disposed in the first through hole T1 and the second through hole T2 of the multilayer circuit structure 110, and the first circuit layer 140 and the second circuit layer 150 respectively expose the first side 122 and the second side 124 of the gas-permeable structure 120. In this way, the gas-permeable structure 120 and the heat conducting component 130 can dissipate heat in a thickness direction (i.e., the Z direction) of the package substrate 100a; in addition, the gas-permeable structure 120 can also dissipate heat in a plane direction (i.e., the X-Y direction) of the package substrate 100a due to its mesh form design, and outside air A can directly pass through the gas-permeable structure 120 to dissipate heat inside the package substrate 100a. In short, the package substrate 100a of the embodiment can have a better heat dissipation effect. In addition, the build-up circuit structure 160 formed by the patterned photo-imageable dielectric layers 162 and the patterned circuit layers 164 can increase the circuit density of the package substrate 100a and can shorten the path of signal transmission.

Figure 2B:
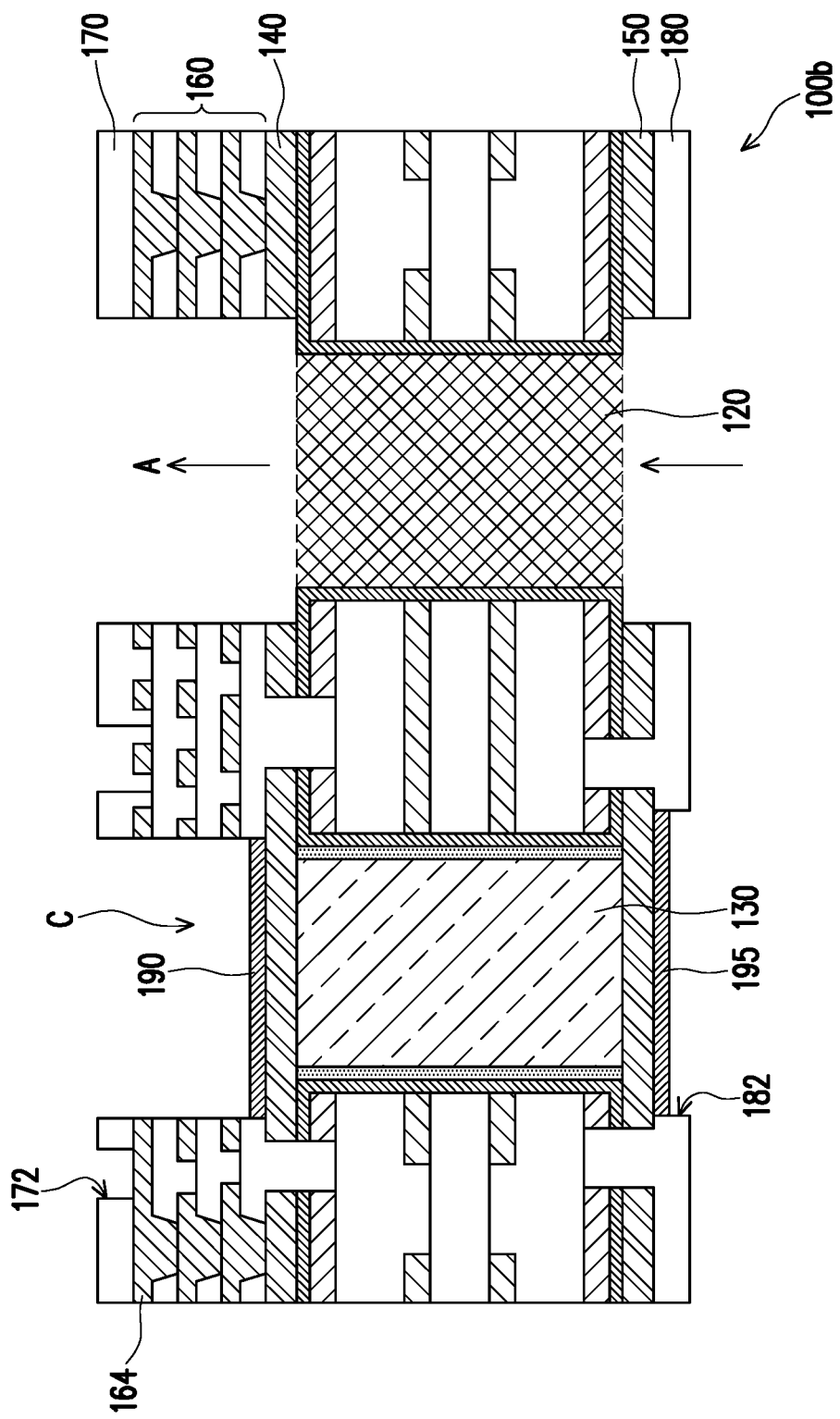
FIG. 2B is a schematic cross-sectional view showing a partial step of a manufacturing method of a package substrate according to still another embodiment of the disclosure.

In another embodiment, referring to FIG. 2B, subsequent to the step of FIG. 1F, a first solder mask layer 170 may be formed on the build-up circuit structure 160, and a second solder mask layer 180 may be formed on the second circuit layer 150. The first solder mask layer 170 has at least one first opening 172, and the first opening 172 exposes a portion of the patterned circuit layer 164 of the build-up circuit structure 160. The second solder mask layer 180 has at least one second opening 182, and the second opening 182 exposes a portion of the second circuit layer 150. Next, a first surface treatment layer 190 is formed on the first circuit layer 140 forming the recess C, and a second surface treatment layer 195 is formed on the second circuit layer 150 exposed by the second solder mask layer 180. By this time, the manufacturing of the package substrate 100b has been completed.

Figure 2C:
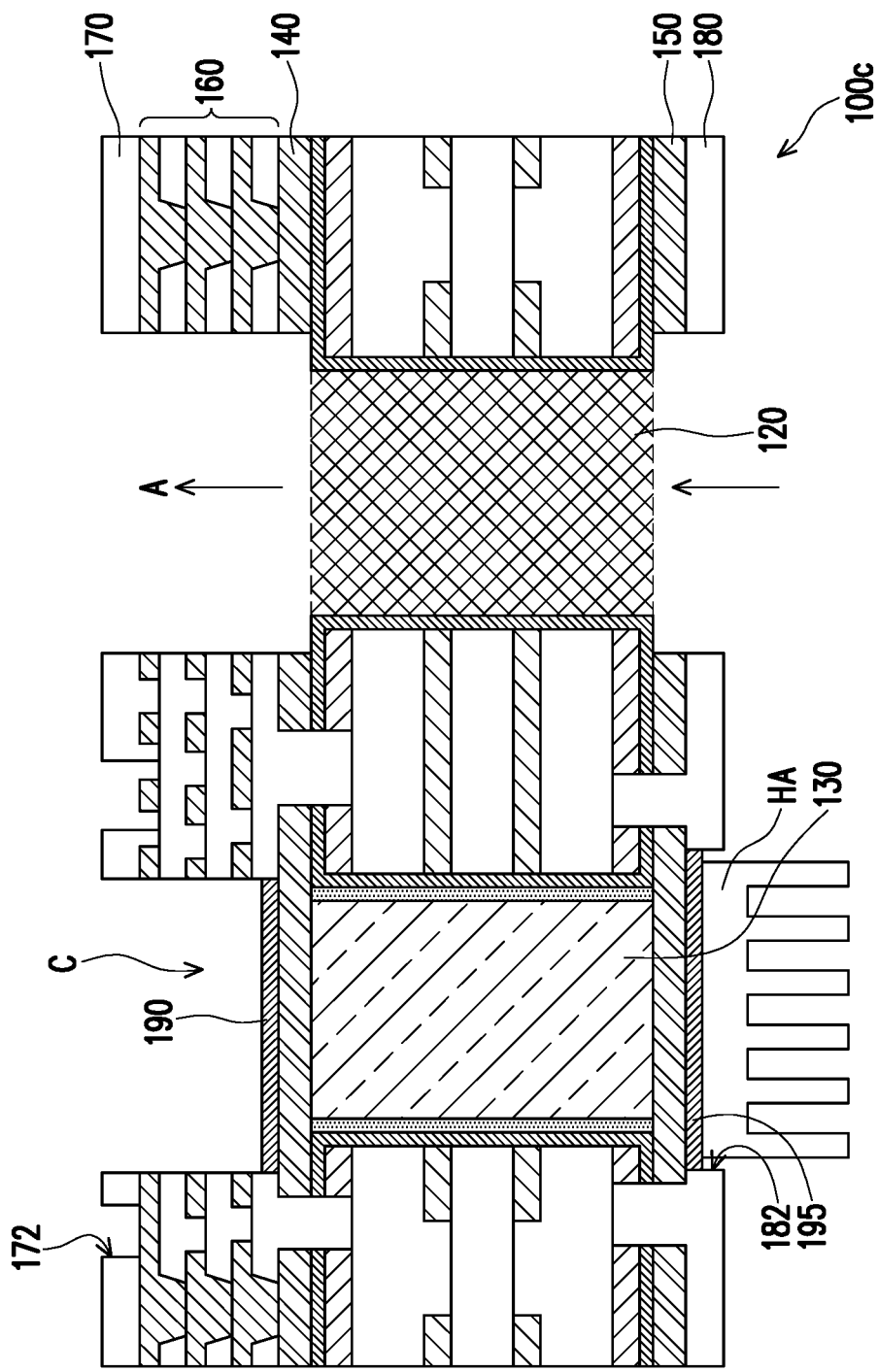
FIG. 2C is a schematic cross-sectional view showing a partial step of a manufacturing method of a package substrate according to yet another embodiment of the disclosure.

In another embodiment, referring to FIG. 2C, subsequent to the step of FIG. 2B, in order to further improve the heat dissipation efficiency, a heat dissipation assembly HA may be selectively disposed in the second opening 182 of the second solder mask layer 180, wherein the heat dissipation assembly HA contacts the second circuit layer 150 through the second surface treatment layer 195. That is, the heat dissipation assembly HA indirectly contacts the second circuit layer 150. Here, the heat dissipation assembly HA is, for example, a heat dissipation block, a heat dissipation fin or a heat pipe, but it is not limited thereto. By this time, the manufacturing of the package substrate 100c has been completed.

Figure 3:
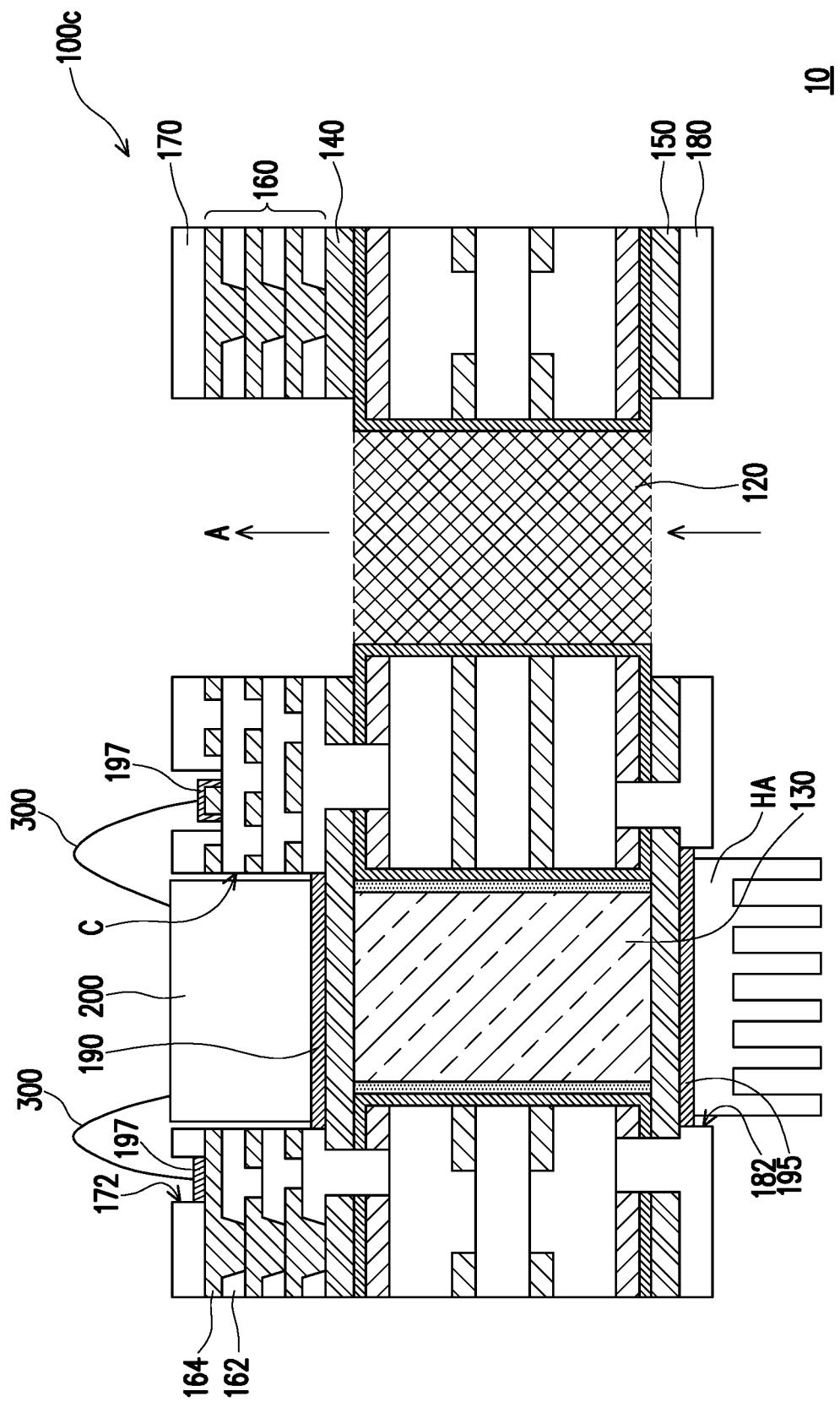
FIG. 3 is a schematic cross-sectional view showing a package substrate carrying a heat generating component according to an embodiment of the disclosure.

FIG. 3 is a schematic cross-sectional view showing a package substrate carrying a heat generating component according to an embodiment of the disclosure. Referring to FIG. 3, a package structure 10 of the embodiment includes the package substrate 100c of FIG. 2C and a wafer 200, wherein the wafer 200 is disposed in the recess C and is electrically connected to the patterned circuit layer 164 of the build-up circuit structure 160 on the outermost side by a wire 300. In order to protect the patterned circuit layer 164 on the outermost side, the embodiment may further form a surface treatment layer 197 to cover the patterned circuit layer 164 on the outermost side exposed by the first opening 172 of the first solder mask layer 170. The wire 300 is directly connected to the surface treatment layer 197 and the wafer 200.

Since the wafer 200 may be disposed in the recess C, the thickness of the overall package structure 10 does not increase too much. In addition, the wafer 200 can transmit heat to the outside through the first surface treatment layer 190, the first circuit layer 140, the heat conducting component 130, the second circuit layer 150, the second surface treatment layer 195, and the heat dissipation assembly HA; that is, the wafer 200 can dissipate heat in the thickness direction (i.e., the Z direction) of the package substrate 100c. In addition to dissipating heat in the thickness direction (i.e., the Z direction) of the package substrate 100c, the gas-permeable structure 120 can also dissipate heat in the plane direction (i.e., the X-Y direction) of the package substrate 100c due to its mesh form design, and the outside air A can directly pass through the gas-permeable structure 120 to dissipate heat inside the package substrate 100c. In short, the package structure 10 of the embodiment can have a better heat dissipation effect.

In summary, in the design of the package substrate of the disclosure, the gas-permeable structure is in the form of a mesh, and the gas-permeable structure and the heat conducting component are respectively disposed in the first through hole and the second through hole of the multilayer circuit structure, and the first circuit layer and the second circuit layer respectively expose the first side and the second side of the gas-permeable structure. In this way, the gas-permeable structure and the heat conducting component can dissipate heat in the thickness direction (i.e., the Z direction) of the package substrate; in addition, the gas-permeable structure can also dissipate heat in the plane direction (i.e., the X-Y direction) of the package substrate due to its mesh form design. In short, the package substrate of the disclosure can have a better heat dissipation effect. In addition, the build-up circuit structure formed by the patterned photo-imageable dielectric layers and the patterned circuit layers can increase the circuit density of the package substrate and can shorten the path of signal transmission.

Although the disclosure has been described with reference to the above embodiments, they are not intended to limit the disclosure. It will be apparent to one of ordinary skill in the art that variations and modifications to the described embodiments may be made without departing from the spirit and the scope of the disclosure. Accordingly, the scope of the disclosure will be defined by the attached claims and their equivalents and not by the above detailed descriptions.

What is claimed is:

1. A package substrate, comprising:
    a multilayer circuit structure having an upper surface and a lower surface opposite to each other, and a first through hole and a second through hole connecting the upper surface and the lower surface;
    a gas-permeable structure being in the form of a mesh and disposed in the first through hole;
    a heat conducting component disposed in the second through hole;
    a first circuit layer disposed on the upper surface of the multilayer circuit structure, covering the upper surface and a top surface of the heat conducting component, and exposing a first side of the gas-permeable structure;
    a second circuit layer disposed on the lower surface of the multilayer circuit structure, covering the lower surface and a bottom surface of the heat conducting component, and exposing a second side of the gas-permeable structure; and
    a build-up circuit structure disposed on the first circuit layer and comprising at least one patterned photo-imageable dielectric layer and at least one patterned circuit layer alternately stacked, wherein the patterned photo-imageable dielectric layer has at least one opening and a receiving opening exposing a portion of the first circuit layer, the patterned circuit layer is electrically connected to the first circuit layer by the opening, and the build-up circuit structure and the first circuit layer exposed by the receiving opening form a recess.

2. The package substrate according to claim 1, further comprising:
    a seed layer covering the upper surface, the lower surface, an inner wall of the first through hole, and an inner wall of the second through hole of the multilayer circuit structure.

3. The package substrate according to claim 1, further comprising:
    an insulating material disposed in the second through hole and located between the heat conducting component and the second through hole.

4. The package substrate according to claim 1, further comprising:
    a first solder mask layer disposed on the build-up circuit structure and having at least one first opening, wherein the first opening exposes a portion of the build-up circuit structure; and
    a second solder mask layer disposed on the second circuit layer and having at least one second opening, wherein the second opening exposes a portion of the second circuit layer.

5. The package substrate according to claim 4, further comprising:
    a heat dissipation assembly disposed in the second opening of the second solder mask layer and contacting the second circuit layer.

6. The package substrate according to claim 5, wherein the heat dissipation assembly comprises a heat dissipation block, a heat dissipation fin or a heat pipe.

7. The package substrate according to claim 4, further comprising:
    a first surface treatment layer disposed on the first circuit layer forming the recess; and
    a second surface treatment layer disposed on the second circuit layer exposed by the second solder mask layer.

8. The package substrate according to claim 1, wherein a material of the gas-permeable structure comprises metal, graphite, synthetic diamond or ceramic.

9. The package substrate according to claim 1, wherein a material of the heat conducting component comprises ceramic, graphite, metal, synthetic diamond or a combination of the foregoing materials.

10. The package substrate according to claim 1, wherein the multilayer circuit structure comprises:
    a core layer having a first surface and a second surface opposite to each other and comprising a core dielectric layer, a first patterned copper foil layer, and a second patterned copper foil layer, wherein the core dielectric layer has a first side surface and a second side surface opposite to each other, the first patterned copper foil layer is disposed on the first side surface of the core dielectric layer and exposes a portion of the first side surface, and the second patterned copper foil layer is disposed on the second side surface of the core dielectric layer and exposes a portion of the second side surface;
    a first dielectric layer disposed on the first surface of the core layer;
    a second dielectric layer disposed on the second surface of the core layer;

a first inner circuit layer disposed on the first dielectric layer; and a second inner circuit layer disposed on the second dielectric layer.

11. A manufacturing method of a package substrate, comprising:

forming a multilayer circuit structure, the multilayer circuit structure having an upper surface and a lower surface opposite to each other, and a first through hole and a second through hole connecting the upper surface and the lower surface;

respectively disposing a gas-permeable structure and a heat conducting component in the first through hole and the second through hole;

respectively forming a first circuit layer and a second circuit layer on the upper surface and the lower surface of the multilayer circuit structure, wherein the first circuit layer covers the upper surface and a top surface of the heat conducting component and exposes a first side of the gas-permeable structure, and the second circuit layer covers the lower surface and a bottom surface of the heat conducting component and exposes a second side of the gas-permeable structure;

forming a photo-imageable dielectric material layer on the first circuit layer;

performing an exposure process and a development process on the photo-imageable dielectric material layer to form a patterned photo-imageable dielectric layer, wherein the patterned photo-imageable dielectric layer has at least one opening and a receiving opening exposing a portion of the first circuit layer; and forming a patterned circuit layer on the patterned photo-imageable dielectric layer, wherein the patterned circuit layer is electrically connected to the first circuit layer by the opening, the patterned photo-imageable dielectric layer and the patterned circuit layer form a build-up circuit structure, and the build-up circuit structure and the first circuit layer exposed by the receiving opening form a recess.

12. The manufacturing method of the package substrate according to claim 11, further comprising:

before respectively disposing the gas-permeable structure and the heat conducting component in the first through hole and the second through hole, forming a seed layer to cover the upper surface, the lower surface, an inner wall of the first through hole, and an inner wall of the second through hole of the multilayer circuit structure.

13. The manufacturing method of the package substrate according to claim 11, further comprising:

after respectively disposing the gas-permeable structure and the heat conducting component in the first through hole and the second through hole and before respectively forming the first circuit layer and the second circuit layer on the upper surface and the lower surface of the multilayer circuit structure, forming an insulating material in the second through hole so that the insulating material is located between the heat conducting component and the second through hole.

14. The manufacturing method of the package substrate according to claim 11, further comprising:

after forming the build-up circuit structure, forming a first solder mask layer on the build-up circuit structure, and forming a second solder mask layer on the second circuit layer, wherein the first solder mask layer has at least one first opening, the first opening exposes a portion of the build-up circuit structure, the second solder mask layer has at least one second opening, and the second opening exposes a portion of the second circuit layer.

15. The manufacturing method of the package substrate according to claim 14, further comprising:

after forming the first solder mask layer and the second solder mask layer, disposing a heat dissipation assembly in the second opening of the second solder mask layer, wherein the heat dissipation assembly contacts the second circuit layer.

16. The manufacturing method of the package substrate according to claim 15, wherein the heat dissipation assembly comprises a heat dissipation block, a heat dissipation fin or a heat pipe.

17. The manufacturing method of the package substrate according to claim 14, further comprising:

after forming the first solder mask layer and the second solder mask layer, forming a first surface treatment layer on the first circuit layer forming the recess, and forming a second surface treatment layer on the second circuit layer exposed by the second solder mask layer.

18. The manufacturing method of the package substrate according to claim 11, wherein a material of the gas-permeable structure comprises metal, graphite, synthetic diamond or ceramic.

19. The manufacturing method of the package substrate according to claim 11, wherein a material of the heat conducting component comprises ceramic, graphite, metal, synthetic diamond or a combination of the foregoing materials.

20. The manufacturing method of the package substrate according to claim 11, wherein forming the multilayer circuit structure comprises:

providing a core layer, the core layer having a first surface and a second surface opposite to each other and comprising a core dielectric layer, a first patterned copper foil layer, and a second patterned copper foil layer, wherein the core dielectric layer has a first side surface and a second side surface opposite to each other, the first patterned copper foil layer is disposed on the first side surface of the core dielectric layer and exposes a portion of the first side surface, and the second patterned copper foil layer is disposed on the second side surface of the core dielectric layer and exposes a portion of the second side surface;

bonding a first dielectric layer and a first inner circuit layer located on the first dielectric layer onto the first surface of the core layer, and bonding a second dielectric layer and a second inner circuit layer located on the second dielectric layer onto the second surface of the core layer; and performing a drilling process on the first inner circuit layer, the first dielectric layer, the core layer, the second dielectric layer, and the second inner circuit layer to form the first through hole and the second through hole.

* * * * *